(12) United States Patent
Kolman et al.

(10) Patent No.: US 7,373,360 B2
(45) Date of Patent: *May 13, 2008

(54) METHODS AND APPARATUS THAT USE CONTEXTUAL TEST NUMBER FACTORS TO ASSIGN TEST NUMBERS

(75) Inventors: Robert S. Kolman, Longmont, CO (US); Reid Hayhow, La Porte, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 557 days.

This patent is subject to a terminal disclaimer.

(21) Appl. No.: 10/839,891

(22) Filed: May 5, 2004

(65) Prior Publication Data

US 2005/0262080 A1 Nov. 24, 2005

(51) Int. Cl.
*G06F 7/00* (2006.01)
*G06F 17/00* (2006.01)

(52) U.S. Cl. .................................. 707/104.1; 702/108
(58) Field of Classification Search ............. 707/1–10, 707/104.1; 702/109–126
See application file for complete search history.

(56) References Cited

U.S. PATENT DOCUMENTS

| | | | | |
|---|---|---|---|---|
| 4,873,687 A | * | 10/1989 | Breu | 714/4 |
| 5,799,321 A | * | 8/1998 | Benson | 707/201 |
| 6,219,626 B1 | * | 4/2001 | Steinmetz et al. | 702/183 |
| 6,279,007 B1 | * | 8/2001 | Uppala | 707/101 |
| 6,385,552 B1 | * | 5/2002 | Snyder | 702/123 |
| 6,473,707 B1 | * | 10/2002 | Grey | 702/123 |
| 6,598,183 B1 | * | 7/2003 | Grieco et al. | 714/43 |
| 6,618,828 B1 | * | 9/2003 | Armstrong | 714/727 |
| 6,804,709 B2 | * | 10/2004 | Manjure et al. | 709/220 |
| 7,139,672 B2 | * | 11/2006 | Dorough et al. | 702/119 |
| 2006/0167643 A1 | * | 7/2006 | Casto et al. | 702/85 |

OTHER PUBLICATIONS

Robert S. Kolman, et al. "Method and Apparatus for Assigning Test Numbers", Filed May 5, 2004, U.S. Patent Application (18 pages of specification, 6 sheets of drawings (Figs. 1-9).

(Continued)

*Primary Examiner*—Hosain Alam
*Assistant Examiner*—Shew-Fen Lin
(74) *Attorney, Agent, or Firm*—Gregory W. Osterloth (57) ABSTRACT

In a method for assigning test numbers, current testflow context information is maintained during the execution of a testflow. If one or more test number factors have been specified for one or more levels of the current testflow context, the test number factors are used to determine a base number for a current test number range. Otherwise, the base number is set to a default base number. Upon execution of a subtest in the testflow, a result of the subtest is assigned a next test number in the current test number range. The following items are then associated in a test number database: 1) an identifier of the subtest, 2) the current testflow context information, 3) the test number, and 4) the base number. When stored in the database, the base number serves as a specification number for its corresponding test number. Also disclosed are other methods and apparatus that use contextual test number factors to assign test numbers.

12 Claims, 8 Drawing Sheets

OTHER PUBLICATIONS

Robert S. Kolman, et al. "Method, Apparatus and Database Using a Map of Linked Data Nodes for Storing Test Numbers", Filed May 5, 2004, U.S. Patent Application (20 pages of specification, 5 sheets of drawings (Figs. 1-10).

Robert S. Kolman, et al. "Methods and Apparatus That Use Contextual Test Number Factors to Assign Test Numbers", Filed May 5, 2004, U.S. Patent Application (25 pages of specification, 7 sheets of drawings (Figs. 1-10).

Robert S. Kolman, et al, "Methods and Apparatus for Identifying Test Number Collisions", Filed May 5, 2004, U.S. Patent Application (22 pages of specification, 7 sheets of drawings (Figs. 1-10).

Robert S. Kolman, et al. "Methods and Apparatus for Handling Test Number Collisions", Filed May 5, 2004, U.S. Patent Application (28 pages of specification, 9 sheets of drawings (Figs. 1-12).

* cited by examiner

| Testflow Context | Base Number |
|---|---|
| "AAA" | 1 |
| "L1" | 10,000 |
| "BBB : L1" | 10,200 |
| "CCC : L1" | 10,220 |
| "L1 : L1" | 12,000 |
| "DDD : L1 : L1" | 12,000 |
| "L1 : L2" | 14,000 |
| "DDD : L1 : L2" | 14,000 |
| "L1 : L3" | 16,000 |
| "DDD : L1 : L3" | 16,000 |
| "L2" | 20,000 |
| "BBB : L2" | 20,200 |
| "CCC : L2" | 20,220 |
| "L2 : L1" | 22,000 |
| "DDD : L2 : L1" | 22,000 |
| "L2 : L2" | 24,000 |
| "DDD : L2 : L2" | 24,000 |
| "L2 : L3" | 26,000 |
| "DDD : L2 : L3" | 26,000 |
| "L3" | 30,000 |
| "BBB : L3" | 30,200 |
| "CCC : L3" | 30,220 |
| "L3 : L1" | 32,000 |
| "DDD : L3 : L1" | 32,000 |
| "L3 : L2" | 34,000 |
| "DDD : L3 : L2" | 34,000 |
| "L3 : L3" | 36,000 |
| "DDD : L3 : L3" | 36,000 |
| "EEE" | 1,200 |

| | | | | | |
|---|---|---|---|---|---|
| | 1 | "AAA : Subtest1" | 1 | 1 | "pass" |
| | 2 | "AAA : Subtest2" | 1 | 2 | "pass" |
| 600 | 3 | "AAA : Subtest3" | 1 | 700 | 3 | "pass" |
| | 10,200 | "BBB : L1 : Subtest1" | 10,200 | 10,200 | "pass" |
| | 10,201 | "BBB : L1 : Subtest2" | 10,200 | 10,201 | "fail" |
| | 10,202 | "BBB : L1 : Subtest3" | 10,200 | 10,202 | "pass" |
| | 10,220 | "CCC : L1 : Subtest1" | 10,220 | 10,220 | "pass" |
| | 10,221 | "CCC : L1 : Subtest2" | 10,220 | 10,221 | "pass" |
| | 10,222 | "CCC : L1 : Subtest3" | 10,220 | 10,222 | "pass" |
| | 12,000 | "DDD : L1 : L1 : Subtest1" | 12,000 | 12,000 | "pass" |
| | 12,005 | "DDD : L1 : L1 : Subtest2" | 12,000 | 12,005 | "pass" |
| | 12,010 | "DDD : L1 : L1 : Subtest3" | 12,000 | 12,010 | "pass" |
| | 14,000 | "DDD : L1 : L2 : Subtest1" | 14,000 | 14,000 | "pass" |
| | 14,005 | "DDD : L1 : L2 : Subtest2" | 14,000 | 14,005 | "pass" |
| | 14,010 | "DDD : L1 : L2 : Subtest3" | 14,000 | 14,010 | "pass" |
| | 16,000 | "DDD : L1 : L3 : Subtest1" | 16,000 | 16,000 | "pass" |
| | 16,005 | "DDD : L1 : L3 : Subtest2" | 16,000 | 16,005 | "pass" |
| | 16,010 | "DDD : L1 : L3 : Subtest3" | 16,000 | 16,010 | "pass" |
| | 20,200 | "BBB : L2 : Subtest1" | 20,200 | 20,200 | "pass" |
| | 20,201 | "BBB : L2 : Subtest2" | 20,200 | 20,201 | "pass" |
| | 20,202 | "BBB : L2 : Subtest3" | 20,200 | 20,202 | "pass" |
| | 20,220 | "CCC : L2 : Subtest1" | 20,220 | 20,220 | "pass" |
| | 20,221 | "CCC : L2 : Subtest2" | 20,220 | 20,221 | "pass" |
| | 20,222 | "CCC : L2 : Subtest3" | 20,220 | 20,222 | "pass" |
| | 22,000 | "DDD : L2 : L1 : Subtest1" | 22,000 | 22,000 | "pass" |
| | 22,005 | "DDD : L2 : L1 : Subtest2" | 22,000 | 22,005 | "pass" |
| | 22,010 | "DDD : L2 : L1 : Subtest3" | 22,000 | 22,010 | "pass" |
| | 24,000 | "DDD : L2 : L2 : Subtest1" | 24,000 | 24,000 | "pass" |
| | 24,005 | "DDD : L2 : L2 : Subtest2" | 24,000 | 24,005 | "pass" |
| | 24,010 | "DDD : L2 : L2 : Subtest3" | 24,000 | 24,010 | "pass" |
| | 26,000 | "DDD : L2 : L3 : Subtest1" | 26,000 | 26,000 | "pass" |
| | 26,005 | "DDD : L2 : L3 : Subtest2" | 26,000 | 26,005 | "pass" |
| | 26,010 | "DDD : L2 : L3 : Subtest3" | 26,000 | 26,010 | "pass" |
| | 30,200 | "BBB : L3 : Subtest1" | 30,200 | 30,200 | "fail" |
| | 30,201 | "BBB : L3 : Subtest2" | 30,200 | 30,201 | "fail" |
| | 30,202 | "BBB : L3 : Subtest3" | 30,200 | 30,202 | "fail" |
| | 30,220 | "CCC : L3 : Subtest1" | 30,220 | 30,220 | "pass" |
| | 30,221 | "CCC : L3 : Subtest2" | 30,220 | 30,221 | "pass" |
| | 30,222 | "CCC : L3 : Subtest3" | 30,220 | 30,222 | "pass" |
| | 32,000 | "DDD : L3 : L1 : Subtest1" | 32,000 | 32,000 | "pass" |
| | 32,005 | "DDD : L3 : L1 : Subtest2" | 32,000 | 32,005 | "pass" |
| | 32,010 | "DDD : L3 : L1 : Subtest3" | 32,000 | 32,010 | "pass" |
| | 34,000 | "DDD : L3 : L2 : Subtest1" | 34,000 | 34,000 | "pass" |
| | 34,005 | "DDD : L3 : L2 : Subtest2" | 34,000 | 34,005 | "pass" |
| | 34,010 | "DDD : L3 : L2 : Subtest3" | 34,000 | 34,010 | "pass" |
| | 36,000 | "DDD : L3 : L3 : Subtest1" | 36,000 | 36,000 | "pass" |
| | 36,005 | "DDD : L3 : L3 : Subtest2" | 36,000 | 36,005 | "pass" |
| FIG. 6 | 36,010 | "DDD : L3 : L3 : Subtest3" | 36,000 | FIG. 7 | 36,010 | "pass" |
| | 1,200 | "EEE : Subtest1" | 1,200 | 1,200 | "pass" |
| | 1,201 | "EEE : Subtest2" | 1,200 | 1,201 | "pass" |
| | 1,202 | "EEE : Subtest3" | 1,200 | 1,202 | "pass" |

```
       [TestSuiteNames]              [TestNumbers]
0      "AAA"              800    22000  "T3 : L2 : L1 : S0"    FIG. 8
1      "BBB"                     22005  "T3 : L2 : L1 : S1"
2      "CCC"                     22010  "T3 : L2 : L1 : S2"
3      "DDD"                     24000  "T3 : L2 : L2 : S0"
4      "EEE"                     24005  "T3 : L2 : L2 : S1"
       [SubtestNames]             24010  "T3 : L2 : L2 : S2"
0      "Subtest1"                 26000  "T3 : L2 : L3 : S0"
1      "Subtest2"                 26005  "T3 : L2 : L3 : S1"
2      "Subtest3"                 26010  "T3 : L2 : L3 : S2"
       [VectorNames]              30200  "T1 : L3 : S0"
       [PinNames]                 30201  "T1 : L3 : S1"
       [TestNumbers]              30202  "T1 : L3 : S2"
1      "T0 : S0"                  30220  "T2 : L3 : S0"
2      "T0 : S1"                  30221  "T2 : L3 : S1"
3      "T0 : S2"                  30222  "T2 : L3 : S2"
10200  "T1 : L1 : S0"             32000  "T3 : L3 : L1 : S0"
10201  "T1 : L1 : S1"             32005  "T3 : L3 : L1 : S1"
10202  "T1 : L1 : S2"             32010  "T3 : L3 : L1 : S2"
10220  "T2 : L1 : S0"             34000  "T3 : L3 : L2 : S0"
10221  "T2 : L1 : S1"             34005  "T3 : L3 : L2 : S1"
10222  "T2 : L1 : S2"             34010  "T3 : L3 : L2 : S2"
12000  "T3 : L1 : L1 : S0"        36000  "T3 : L3 : L3 : S0"
12005  "T3 : L1 : L1 : S1"        36005  "T3 : L3 : L3 : S1"
12010  "T3 : L1 : L1 : S2"        36010  "T3 : L3 : L3 : S2"
14000  "T3 : L1 : L2 : S0"        1200   "T4 : S0"
14005  "T3 : L1 : L2 : S1"        1201   "T4 : S1"
14010  "T3 : L1 : L2 : S2"        1202   "T4 : S2"
16000  "T3 : L1 : L3 : S0"
16005  "T3 : L1 : L3 : S1"
16010  "T3 : L1 : L3 : S2"                                    1000
20200  "T1 : L2 : S0"
20201  "T1 : L2 : S1"                                  [ContextTypes]
20202  "T1 : L2 : S2"                                  0   "TestSuite"
20220  "T2 : L2 : S0"                                  1   "Loop"
20221  "T2 : L2 : S1"                                  2   "Subtest"
20222  "T2 : L2 : S2"                                  3   "Vector"
                                                       4   "Pin"

FIG. 10
```

906                            900         906
904   numLayers = 3                    1100   numLayers = 3         900a
      Type = [TestSuite, Loop, Subtest]      Type = [0, 1, 2]
      Index = [1, 1, 0]                      Index = [1, 1, 0]
902             FIG. 9                 902             FIG. 11

METHODS AND APPARATUS THAT USE CONTEXTUAL TEST NUMBER FACTORS TO ASSIGN TEST NUMBERS

BACKGROUND OF THE INVENTION

Some forms of circuit test provide an engineer with large volumes of test results. To assist the engineer in managing and referring to these test results, each test result may be associated with a test number.

The United States patent application of Robert S. Kolman, et al. entitled "Method and Apparatus that use Contextual Test Number Factors to Assign Test Numbers" (Ser. No. 10/839,824, filed the same day as this application) discloses a method for assigning test numbers wherein current test flow context information is maintained during the execution of a test flow. If one or more test number factors have been specified for one or more levels of the current testflow context, the test number factors are used to determine a base number for a current test number range. Otherwise, the base number is set to a default base number. Upon execution of a subtest in the testflow, the result of the subtest is then assigned a next test number in the current test number range.

SUMMARY OF THE INVENTION

One aspect of the invention is embodied in a first method for assigning test numbers. In accordance with the method, current testflow context information is maintained during the execution of a testflow. If one or more test number factors have been specified for one or more levels of the current testflow context, the test number factors are used to determine a base number for a current test number range. Otherwise, the base number is set to a default base number. Upon execution of a subtest in the testflow, a result of the subtest is assigned a next test number in the current test number range. The following items are then associated in a test number database: 1) an identifier of the subtest, 2) the current testflow context information, 3) the test number, and 4) the base number. When stored in the database, the base number serves as a specification number for its corresponding test number.

Another aspect of the invention is embodied in a second method for assigning test numbers. In accordance with the method, current testflow context information is maintained during execution of a testflow. If one or more test number factors have been specified for one or more levels of the current testflow context, the test number factors are used to determine a base number for a current test number range. Otherwise, the base number is set to a default base number. Upon execution of a subtest, a test number database is indexed using index information comprising i) an identifier of the subtest, and ii) the current testflow context information. If a test number corresponding to the index information exists in the database, the base number is compared with a specification number that is associated with the test number. If the base number and specification number match, the test number is assigned to a result of the subtest. If a test number corresponding to the index information does not exist in the database, or if the base number and specification number do not match, a new test number is assigned to the result of the subtest.

Yet another aspect of the invention is embodied in a test number engine. The test number engine comprises computer readable media, and program code that is stored on the computer readable media. The program code comprises code to, in response to a call for a test number, index a map of linked data nodes using a key formed from 1) a numeric identifier of a subtest, and 2) an array of one or more current test flow context values. The program code also comprises code to, upon indexing a data node associated with a test number, compare a specification number associated with the test number to a base number associated with the call. The program code further comprises code to, if the base number and specification number match, satisfy the call by returning the test number. In addition, the program code comprises code to, upon a miss in indexing the map, or upon a mismatch between the base and specification numbers, generate a new test number; satisfy the call by returning the new test number; and associate the new test number with a data node that is linked in the map.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
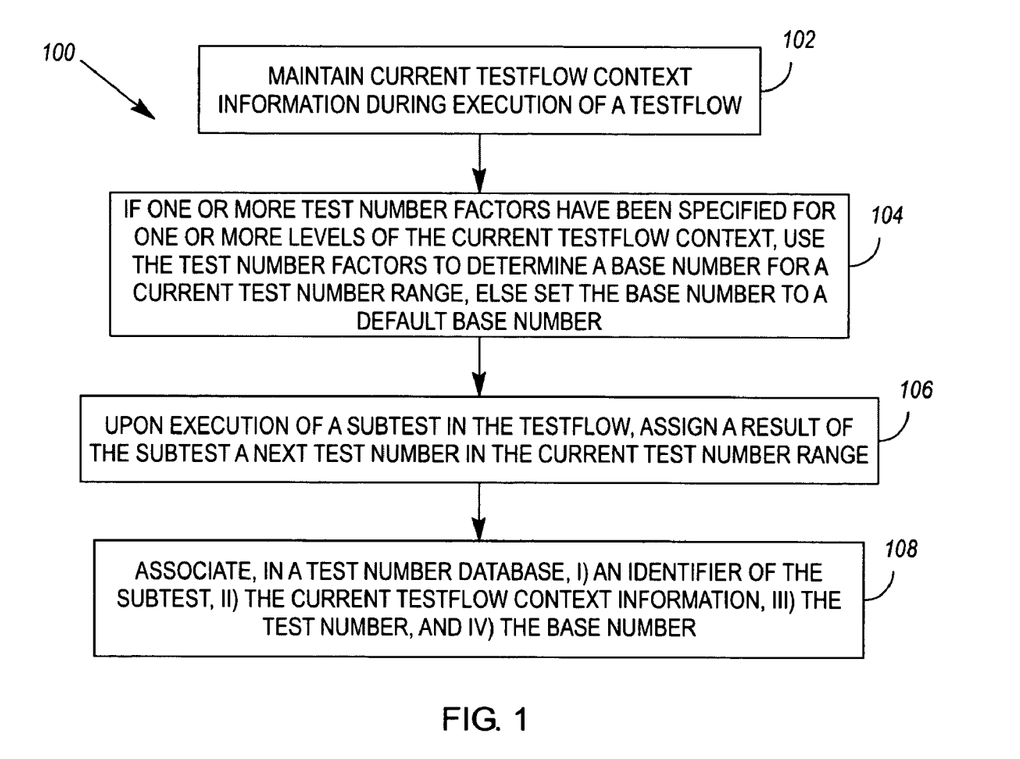
FIG. 1 illustrates a first exemplary method for assigning test numbers.

FIG. 1 illustrates a first exemplary method 100 for assigning test numbers. In accordance with the method 100, current testflow context information is maintained 102 during execution of a testflow.

As defined herein, a "testflow" is any portion of a test program that is used to specify the type, number or order of tests that may be executed during circuit test. Testflow context information may comprise any information that assists in defining what portion of a test program is being executed. By way of example, testflow context information may comprise information such as a test suite designator, a port designator, a vector label, a vector designator, or a pin designator. Testflow context information may also comprise a loop designator and/or loop iteration designator for each of a number of loop layers (e.g., nested loops) that have been entered during execution of a testflow. As used herein, the term "designator" encompasses a string, number or any other means that can be used to designate a test suite, loop or other testflow context.

If one or more test number factors have been specified for one or more levels of the current testflow context, the test number factors are used 104 by the method 100 to determine a base number (e.g., a beginning number or reference number) for a current test number range. Otherwise, the base number is set to a default base number.

In one embodiment of the method 100, the base number is compiled by aggregating (e.g., summing or multiplying) a plurality of test number factors that have been specified for various levels of the current testflow context. By way of example, the test number factors may comprise increments or addends that are specified at any or all of: a loop level, a test suite level, or a subtest level.

In another embodiment of the method 100, a user may only be allowed to specify a single base number per testflow context. In this embodiment, the base number for the current test number range is determined by merely setting the base number equal to the user-specified base number. In this method, there is no aggregation of test number factors. However, a user may still provide base numbers at various points in a testflow, thereby causing certain test numbers to be grouped, for example. Further, because the base numbers are set contextually, test numbers that are assigned for a later test suite do not need to continue from the test numbers assigned for an earlier test suite. Further, if a base number is specified for one test suite, it is not automatically preserved for use with the next test suite.

Upon execution of a subtest in the testflow, the result of the subtest is then assigned 106 a next test number in the current test number range. A "subtest", as defined herein, may be a test that produces multiple test results, but is preferably a test or portion of a test that produces only a single test result. The following items are then associated 108 in a test number database: 1) an identifier of the subtest, 2) the current testflow context information, 3) the test number, and 4) the base number. By including the base number in the database, the base number serves as a "specification number" for determining whether the test number factors associated with a current testflow context have changed. That is, if the test number database is indexed using a subtest identifier and current testflow context information, both a test number and its specification number will be returned. A "hit" in the database signifies that the returned test number is unique. However, if a user has edited a testflow or the test number factors specified therefor, the returned test number may no longer correspond to the specified range for a current testflow context. By comparing a currently generated base number with the returned specification number, it may be determined whether the base number that was previously used to calculate the test number corresponds to the current base number, and test number regeneration can be limited to those instances where it would result in a new and different test number.

Figure 2:
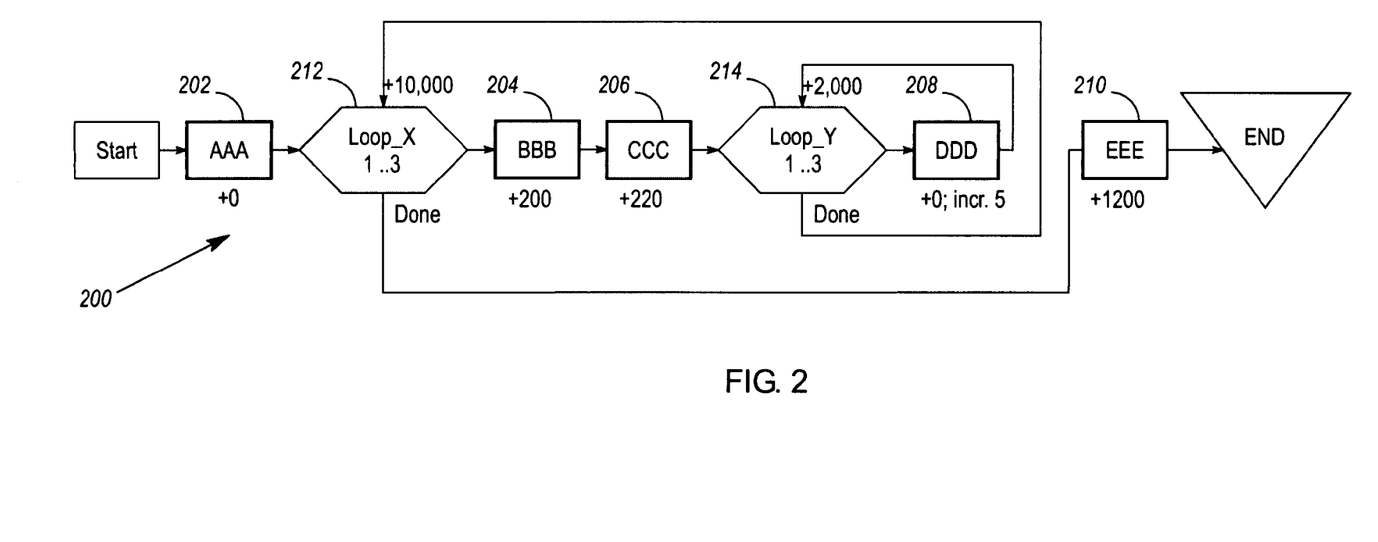
FIG. 2 illustrates an exemplary testflow.

FIG. 2 illustrates an exemplary testflow 200 for which testflow context information may be maintained. By way of example, the testflow 200 could be a system-on-a-chip testflow of the Agilent 93000 SOC Series tester (manufactured by Agilent Technologies, Inc. of Palo Alto, Calif., USA). The testflow 200 comprises five test suites 202, 204, 206, 208, 210, respectively named AAA, BBB, CCC, DDD and EEE. Each of the test suites 202-210 serves to contain and/or specify a number of subtests, and may include one or more test controls (e.g., test methods, test functions or user procedures). The testflow 200 also comprises two loops 212, 214, respectively named Loop_X and Loop_Y. By way of example, each loop 212, 214 specifies that its loop is to be iterated three times (i.e., 1 . . . 3).

Figure 3:
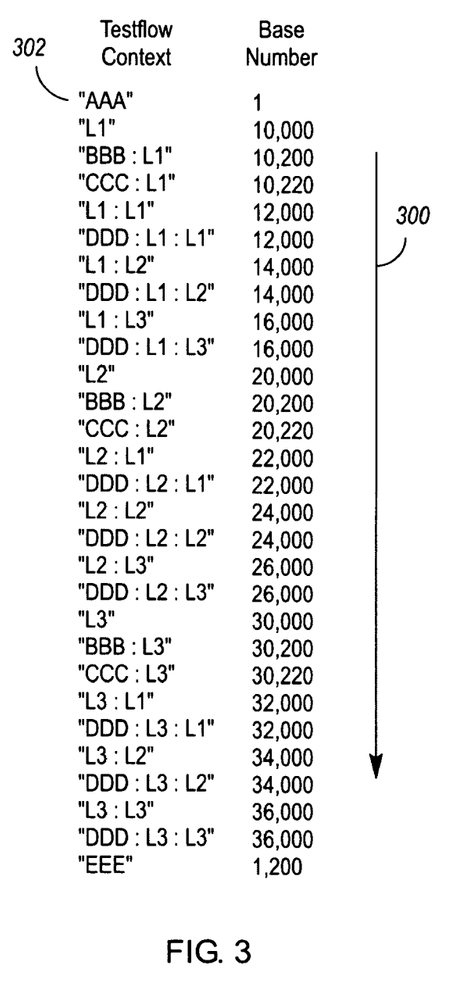
FIG. 3 illustrates a progression of testflow context information for the FIG. 2 testflow.

FIG. 3 illustrates a progression of testflow context information 300 that may be maintained by the method 100 during execution of the testflow 200. Note that the initial testflow context 302 is merely "AAA", or the name of the first encountered test suite. After the test suite AAA has been executed, the testflow context then changes to "L1", which is indicative of the first iteration of Loop_X.

Upon entry into the test suite BBB, the testflow context then changes to "BBB:L1". Note that, for ease of reading, the testflow contexts shown in FIG. 3 adopt the convention of always placing the current test suite's name at the beginning of the context. However, this is certainly not required by the method 100, and need not be done.

Upon first entering Loop_Y, the testflow context changes to "L1:L1". The identities of Loop_X and Loop_Y are therefore inferred from the number and order of loop iterations maintained in the testflow context. However, the identities of the loops could also be called out with specificity, such as by noting the context as "X1:Y1".

Various contexts of the testflow 200 are associated with test number factors. That is, Loop_X is associated with the addend 10,000, test suite BBB is associated with the addend 200, test suite CCC is associated with the addend 220, Loop_Y is associated with the addend 2000, and test suite DDD is associated with the increment 5. Adjacent each testflow context, FIG. 3 illustrates the aggregate base number for the context. Thus, the base number for test suite BBB is 10,200 (10,000+200); the base number for test suite CCC during a first iteration of Loop_X is 10,220 (10,000+220); the base number for test suite DDD during a first iteration of Loop_X and first iteration of Loop_Y is 12,000 (10,000+2,000); and the base number for test suite EEE is 1200. However, the base number for test suite AAA is 1, which is the default base number.

If a test number factor is provided at a loop level (e.g., the addend 10,000 associated with Loop_X), the loop's test number factor may be factored into a base number repeated times. For example, consider the execution of test suite DDD during the second iteration of Loop_X and third iteration of Loop_Y. The base number for this context can be calculated as (10,000*2)+(2,000*3), or 26,000.

Assume now that each of the test suites 202-210 shown in FIG. 2 comprises three subtests, identified as Subtest1, Subtest2, and Subtest3. Note that although subtests of the same name may appear in each of the test suites 202-210, they need not be (and likely will not be) the same subtest. During execution of the testflow 200, the test numbers assigned to test suite AAA would be 1, 2 and 3. The test numbers assigned to test suite BBB during a first iteration of Loop_X would be 10,200, 10,201 and 10,202. Similarly, the test numbers assigned to test suite CCC during a first iteration of Loop_X would be 10,220, 10,221 and 10,222. The test numbers assigned to test suite DDD during first iterations of Loop_X and Loop_Y would be 12,000, 12,005 and 12,010 (i.e., numbers incremented by 5). Finally, the test numbers assigned to test suite EEE would include the integers 1209, 1210 and 1211.

Note that, for some testflows, different contexts of the testflow might intentionally (or unintentionally) share the same test number range. However, test numbers assigned to the two test suites will not collide, because each subtest draws a "next number" from the range, regardless of whether other test suites have already drawn numbers from the range.

Also note that two or more test suites may not only have the same base number, but may be associated with test number ranges that overlap or are interleaved. For example, if two test suites were respectively associated with base numbers of 1200 and 1201, and an increment of five, one test suite might be associated with the test numbers 1200, 1205 and 1210, while the other test suite might be associated with the test numbers 1201, 1206 and 1211. An overlap of test numbers might similarly result from test suites that are respectively associated with the base numbers 1200 and 1301, and an increment of two.

Figure 4:
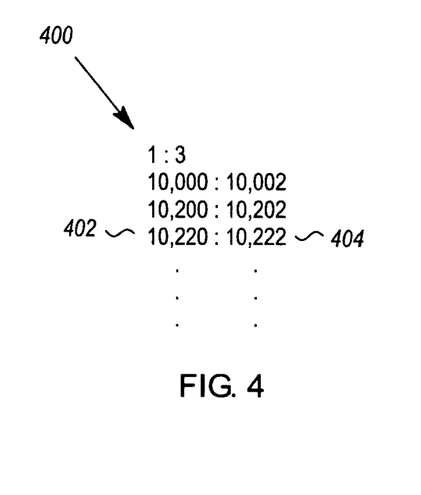
FIG. 4 illustrates an exemplary database of test number ranges.

If the base number that is compiled for the current test number range is new, the base number may be used to initialize a new test number range in a database 400 of test number ranges. Then, for each test number range in the database 400, the test numbers that have been assigned from the test number range may be tracked. One way to do this is to store each range 402 along with the maximum test number 404 that has been assigned from the range. Then, each time a new test number is assigned from a range, its previous maximum test number may be incremented. Depending on the test factors that a user has assigned to a testflow, the increment may be a default increment, or an increment that a user has specified for a particular level or levels of the testflow (e.g., an increment that is associated with a level of a current testflow context).

Figure 5:
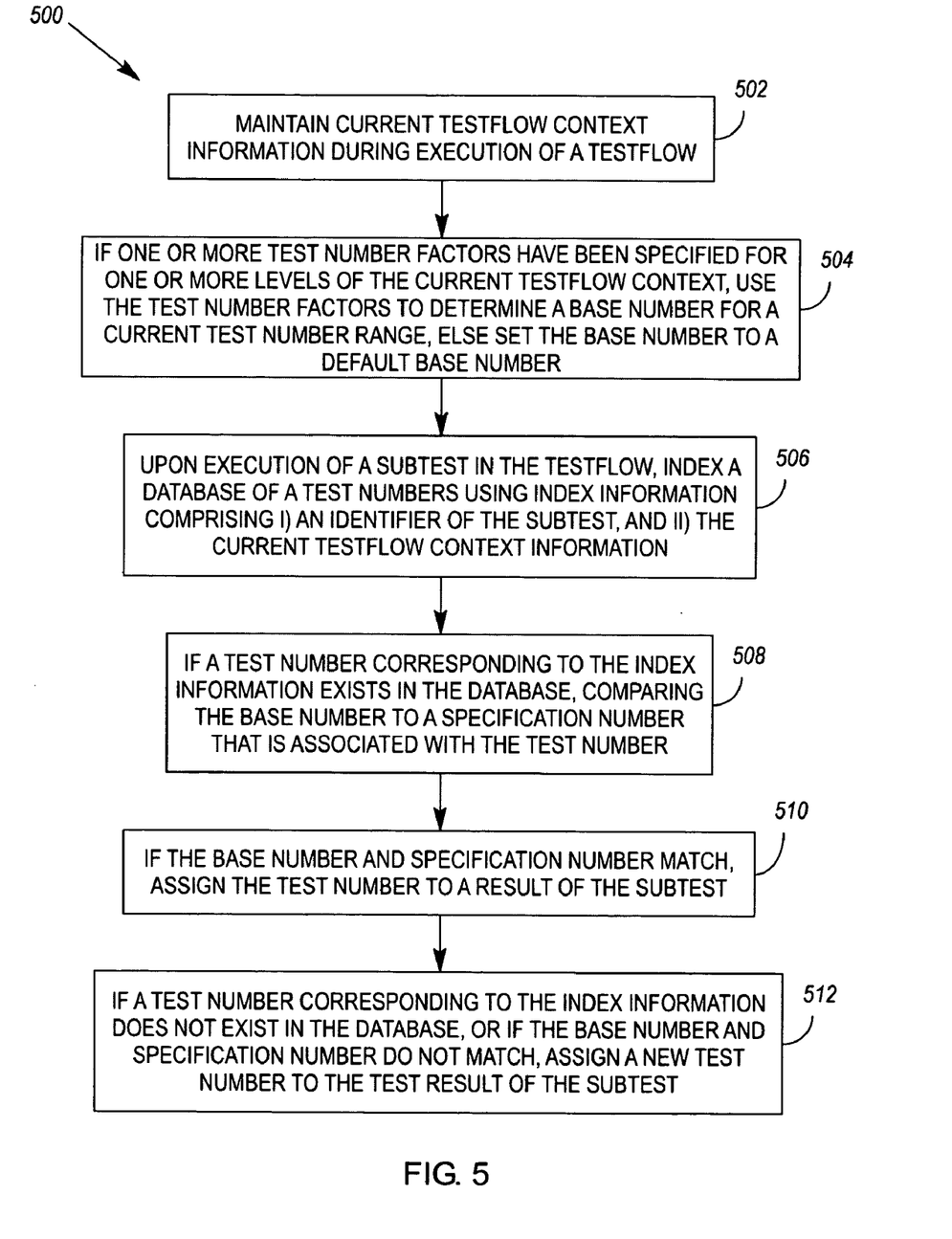
FIG. 5 illustrates a second exemplary method for assigning test numbers.

In one embodiment, the method 100 may be combined with the method for assigning test numbers disclosed in the United States patent application of Robert S. Kolman, et al. entitled "Method and Apparatus for Assigning Test Numbers" (Ser. No. 10/839,887 filed the same day as this application). In accordance with this combination, FIG. 5 illustrates a second exemplary method 500 for assigning test numbers. In method 500, current testflow context information is maintained 502 during the execution of a testflow. If one or more test number factors have been specified for one or more levels of the current testflow context, the method 500 uses 504 the test number factors to determine a base number for a current test number range. Otherwise, the base number is set to a default base number.

Upon execution of a subtest in the testflow, a database of test numbers is indexed 506 using index information comprising 1) an identifier of the subtest, and 2) the current testflow context information. Each test number in the database is associated with a "specification number" which, as previously discussed, is indicative of the "base number" that was used to initially determine the test number. If a test number corresponding to the index information exists in the database, the previously determined base number is compared 508 to the test number's "specification number". If the base number and specification number match, the test number is assigned 510 to a result of the subtest. If a test number corresponding to the index information does not exist in the database, or if the base number and specification number do not match, a new test number is assigned 512 to the result of the subtest. The new test number may be assigned by setting it equal to a next test number in the current test number range.

Figure 6:
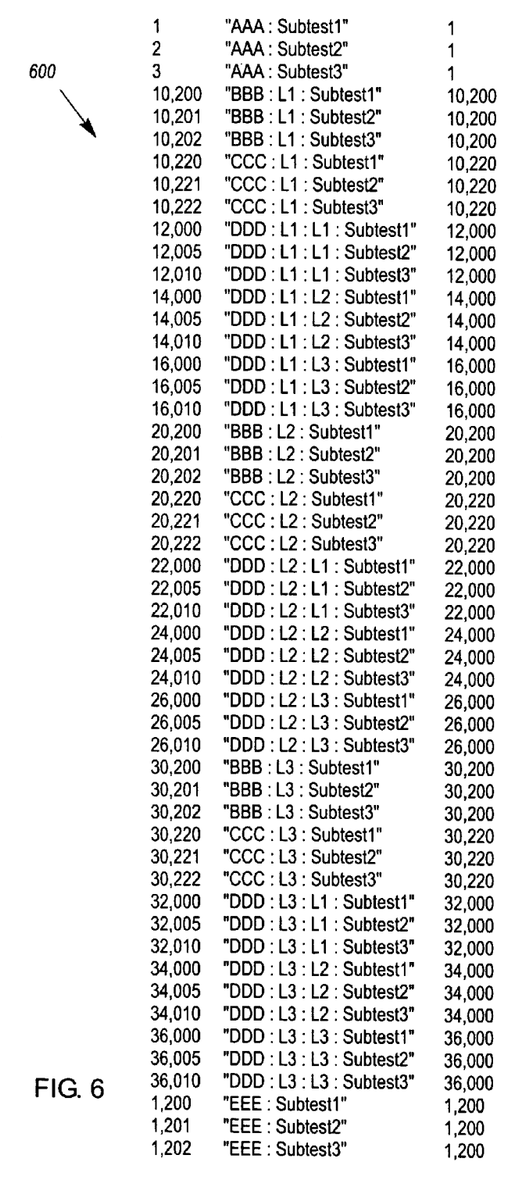
FIG. 6 illustrates a database of test numbers that may be generated in response to execution of the FIG. 2 testflow.
Figure 7:
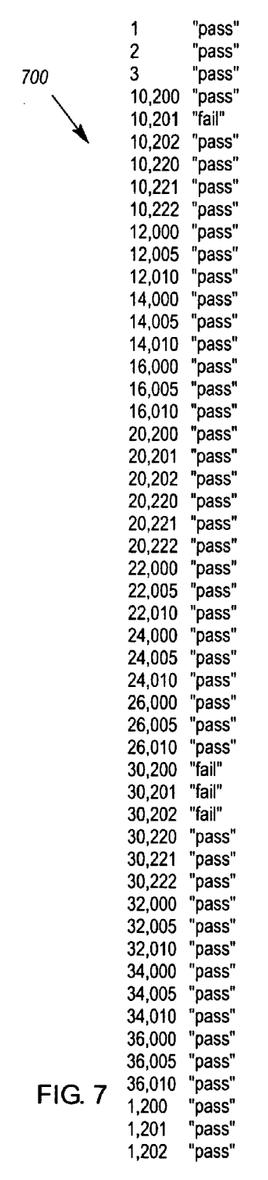
FIG. 7 illustrates a database of test results that may be generated in response to execution of the FIG. 2 testflow.

Turning again to the exemplary testflow 200, upon execution of the first subtest in the testflow 200, index information comprising an identifier of the subtest (Subtest1) and the current testflow context information (AAA) is used to index a database of test numbers. If this is the first execution of the testflow 200, the database will be empty, and a new test number (e.g., 1) will be assigned to the result of Subtest1. The new test number (1) and index information (AAA: Subtest1) will also be associated in the database. During the first execution of the testflow 200, these steps continue, with the use of each successive index resulting in a database "miss", thereby causing a new test number and its associated index information to be added to the database. Thus, after a first execution of the testflow 200, the database of test numbers 600 shown in FIG. 6 may have been created. At the same time, each newly created test number will be assigned to a test result of its corresponding subtest, thereby resulting in the database of test results 700 shown in FIG. 7. Although the test results shown in FIG. 7 are all presented in terms of "pass" or "fail", the test results of an actual test run could also or alternately comprise voltage readings, current readings, impedance measurements, and other sorts of test results.

In addition to being associated with its index information 604, each test number 602 in the database 600 may be associated with the base number 606 from which it was derived.

Assume now that a user edits the testflow 200 to change the test factor number associated with test suite EEE to "+3000". During a second execution of the testflow 200 (after the edit), nearly all of the test numbers assigned to the testflow's results will be drawn from the database 600. However, upon entering test suite EEE, the new base number for the suite's subtest will be "3000". Thus, when the database 600 is indexed to retrieve test numbers for test suite EEE's results, the base number "3000" does not match the specification number "1200". This mismatch then triggers the generation of a new test number, which may not only be assigned to a result of one of test suite EEE's subtests, but which may be used to replace the "1200 series" test number in the database 600. Similarly, the specification number associated with the new test number may be replaced with the base number "3000".

Optionally, either of the methods shown in FIGS. 1 & 5 may be combined with the methods and apparatus disclosed in the United States patent application of Robert S. Kolman, et al. entitled "Method, Apparatus Database Using a Map of Linked Data Nodes for Storing Test Numbers" (Ser. No. 10/839,890, filed the same day as this application). . In accordance with this combination, the strings included in the testflow context information 300 can be converted to context values stored in an array of context values. Thus, each time new testflow context information needs to be maintained by the methods 100, 500, it is determined whether the information is a string and, if so, a numeric equivalent of the string is looked up.

Figures 8, 9, 10, 11:
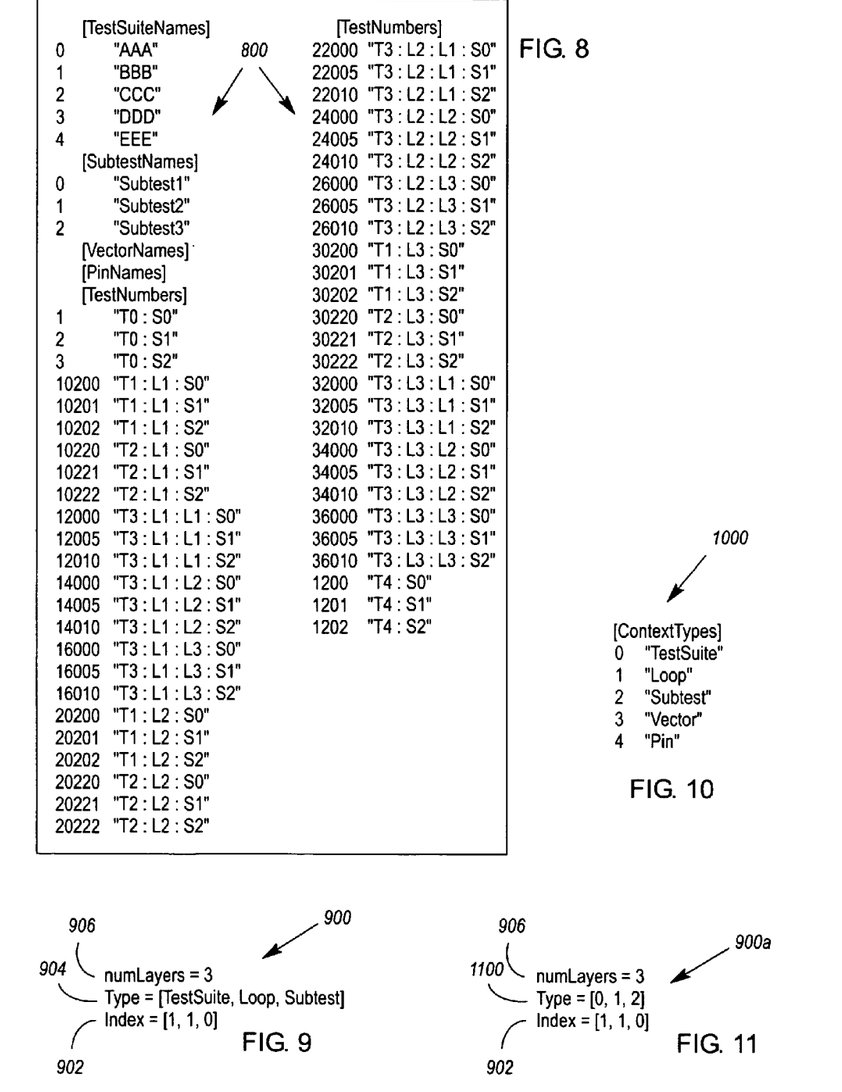
FIG. 8 illustrates a database of look-up tables for converting strings of testflow context information for the FIG. 2 testflow to numeric equivalents.
FIG. 9 illustrates an exemplary key for indexing a map of linked data nodes.
FIG. 10 illustrates a look-up table for converting strings in the Type array of the FIG. 9 key to numeric equivalents.
FIG. 11 illustrates an alternative embodiment of the FIG. 9 key.

FIG. 8 shows a database of look-up tables 800 wherein numeric equivalents are provided for testflow context information of the types [TestSuiteNames], [SubtestNames], [Vector Names] and [PinNames]. It is noted that the exemplary testflow 200 and testflow context information 300 do not provide any vector names or pin names and, thus, the database 800 does not show any entries in these tables. Preferably, the look-up tables 800 are adaptive, meaning that a string that does not yet appear in a corresponding look-up table is assigned a numeric equivalent that is then added to its corresponding look-up table.

Upon converting testflow context strings to their numeric equivalents, one of the "keys" formed by the method 100 or 500 might appear as shown in FIG. 9. Note that the Index array 902 of the key 900 is formed by adding a numeric identifier of the subtest named "Subtest1" (i.e., 0) to the array of context values respresenting the testflow context "BBB: L1". The Index array 902 is thus shown as [1, 1, 0].

The key 900 is also shown to comprise an array 904 of context types (i.e., [TestSuite, Loop, Subtest]), with each context type having a one-to-one correspondence with a context value in the Index array 902. Although context types may alternately be inferred from the number and positions of values in the Index array 902, the array 904 of context types can be useful in indexing a map of linked data nodes (as will be described in more detail later in this description).

Optionally, strings in the Type array 904 of key 900 may be converted to their numeric equivalents, similarly to how testflow context strings are converted to their numeric equivalents. FIG. 10 therefore provides a context type look-up table 1000 for making these conversions. Note that the table 1000 may be a stand-alone table, or may be appended to the database of look-up tables 800. Using the table 1000, the key 900a comprising an array 1100 of "context type" values (i.e., [0, 1, 2]) may be derived.

The maintenance of current testflow context information by the method 100, 500 may further comprise the maintenance of a depth number. Such a depth number 906 is shown in the keys 900, 900a of FIGS. 9 & 11. The depth number 906 (i.e., numLayers=3) is equal to the number of values that are maintained in the Index and Type arrays 902, 904, and may be used to ensure that the key 900 is used to traverse only a fixed number of data nodes in a map of same. Further explanation of the purpose and use of a depth number 906 can be found later in this description.

Figure 12:
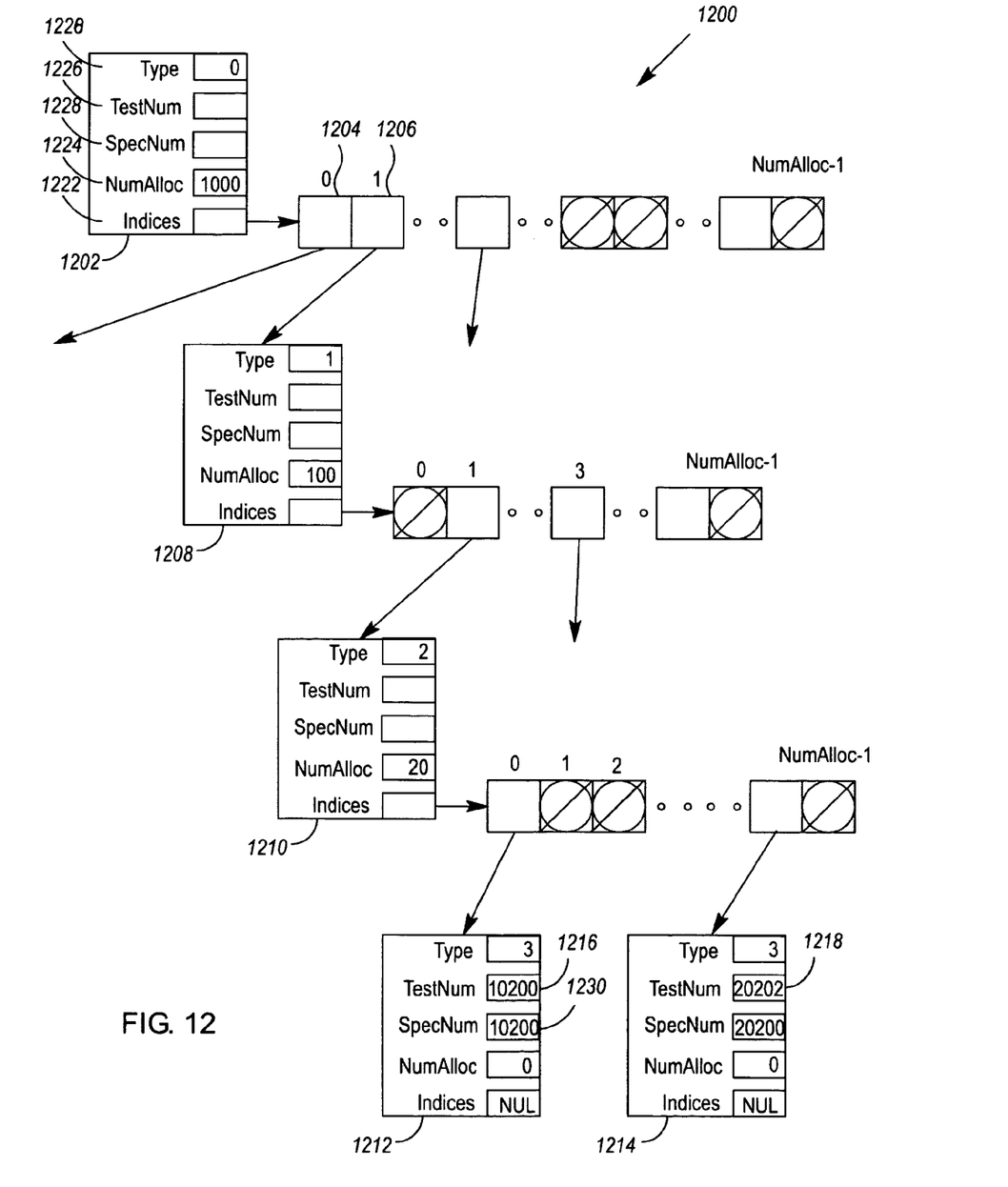
FIG. 12 illustrates an exemplary test number database that can be indexed by the FIG. 11 key.

FIG. 12 illustrates an exemplary test number database 1200 that can be indexed by the key 900a. By way of example, the database 1200 comprises a map of linked data nodes (e.g., nodes 1202, 1204, 1206, 1208, 1210, 1212, 1214), at least one of which is a test suite node 1202 that points to at least one other data node 1204-1208, and at least one of which is a test number node 1212 that is pointed to by another data node 1210. Each of one or more test numbers 1216, 1218 is associated with one of said test number nodes 1212, 1214.

Preferably, the data nodes 1202-1214 of the database 1200 have a homogeneous structure. By way of example, the homogeneous structure may comprise a node type field 1220, and an array 1222 of child node indices. The node type field 1220 may specify one of the context types found in table 1000 (FIG. 10). The array 1222 of child node indices may point to child data nodes 1204-1208 to which a parent data node 1202 is linked.

If useful, each data node (e.g., 1202) may comprise a field 1224 that specifies how many child nodes (e.g., 1204-1208) have been allocated to the data node. Each data node 1202-1214 may also comprise a test number field 1226 and specification number field 1228. However, at least the test number data nodes 1212, 1214 comprise such a field.

The Index array 902 of the key 900a may be used to traverse a number of nodes 1202, 1208, 1210, 1212 of the map 1200. If the map has already been traversed using the key 900a, the key 900a will eventually index a test number data node 1212. The specification number 1230 that is associated with the node 1212 can then be retrieved and compared to a base number of the current testflow context. If the two numbers match, the test number 1216 of the data node 1212 may be associated with the result of a corresponding subtest in a testflow. Otherwise, a new test number may be generated, and the test and specification numbers of the data node 1212 may be updated.

The Type array 1100 and depth number 906 of the key 900a may be used, in one respect, as consistency checks to ensure that the correct type and number of nodes are being traversed. Additionally, if the key 900a specifies the traversal of an invalid node (e.g., one that has not yet been created, allocated or filled), the Type array 1100 and depth number 906 may be used in combination with the Index array 902 to validate the invalid node (e.g., create, allocate or fill the data node).

FIG. 7 illustrates an exemplary database of test results 700 wherein each test result in the database is associated with a test number obtained by means of the method 100 or 500 and test number database 1200.

During the first execution of a testflow (e.g., testflow 200 (FIG. 2)), much if not all of the database 1200 and look-up tables 800, 1000 may be created. The database 1200 and tables 800, 1000 may then be stored such that, upon subsequent execution of the same or similar testflow (e.g., an edited version of the testflow 200), the database 1200 and tables 800, 1000 may be used to streamline test number generation, and may be added to as the identification of new subtests requires.

Preferably, each of the subtests within a test suite is provided a unique subtest name, and enough testflow context information is maintained to ensure that each index into a database of test numbers 600 forms a unique subtest identifier. It is also preferred that each new test number entered into the database 600 is unique from all other test numbers in the database. However, the methods 100, 500 can often provide useful test numbers even when the above controls are not maintained.

Figure 13:
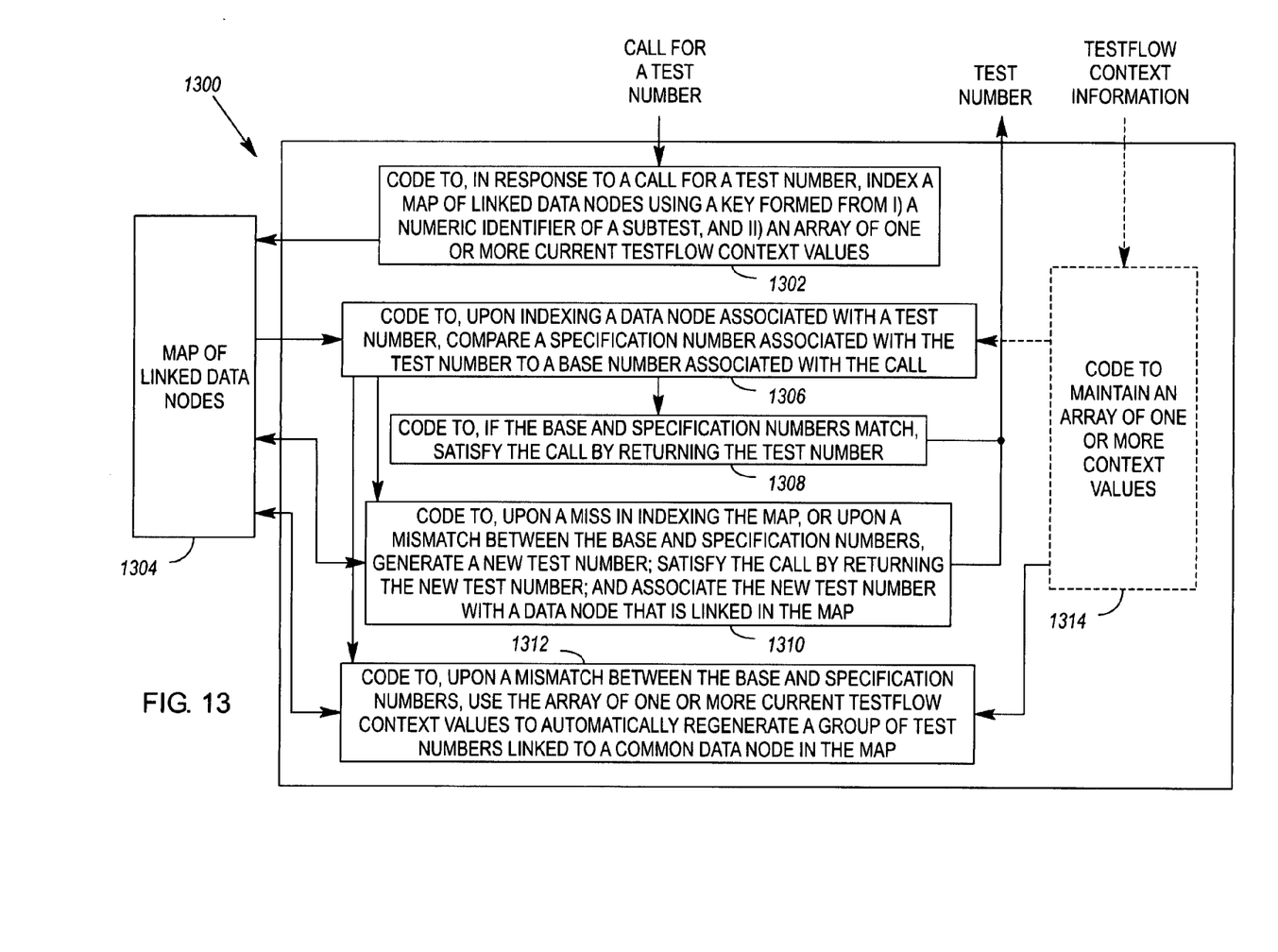
FIG. 13 illustrates an exemplary test number engine.

FIG. 13 illustrates a test number engine 1300. The test number engine 1300 is embodied in program code stored on computer readable media (e.g., a magnetic or optical disk, a fixed or removable disk, or random access or read-only memory (RAM or ROM)). In some embodiments, the program code of the test number engine 1300 may be distributed among various computer readable media associated with one or a plurality of computer systems.

As shown, the test number engine 1300 may comprise code 1302 to, in response to a call for a test number, index a map of linked data nodes 1304 using a key formed from 1) a numeric identifier of a subtest, and 2) an array of one or more current test flow context values. The program code also comprises code 1306 to, upon indexing a data node associated with a test number, compare a specification number associated with the test number to a base number associated with the call. The program code further comprises code 1308 to, if the base number and specification number match, satisfy the call by returning the test number. In addition, the program code comprises code 1310 to, upon a miss in indexing the map, or upon a mismatch between the base and specification numbers, generate a new test number; satisfy the call by returning the new test number; and associate the new test number with a data node that is linked in the map.

The test number engine may further comprise code 1312 to, upon a mismatch between the base and specification numbers, utilize the array of one or more current test flow context values to automatically regenerate a group of test numbers linked to a common data node of the map (e.g., the data nodes 1212, 1214 linked to common data node 1210 in the map 1200).

Optionally, the test number engine 1300 could also comprise code 1314 to maintain the array of current testflow context values. As part of maintaining the array, the code 1314 may use received testflow context strings to look up numeric equivalents of the strings.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A computer-implemented method, comprising:
during execution of a testflow, maintaining current testflow context information;
if one or more test number factors have been specified for one or more levels of the current testflow context, using the test number factors to determine a base number for a current test number range, else setting the base number to a default base number;
upon execution of a subtest in the testflow, indexing a test number database using index information comprising i) an identifier of the subtest, and ii) the current testflow context information, and
if a test number corresponding to the index information exists in the database, comparing said base number with a specification number that is associated with the test number;
if the base number and specification number match, assigning the test number to a result of the subtest;
if a test number corresponding to the index information does not exist in the database, or if said base number and specification number do not match, assigning a new test number to the result of the subtest; and
storing a set of numbered test results in a database, the set including the result of the subtest and its assigned test number.

2. The method of claim 1, further comprising, if the base number and specification number do not match,
replacing the test number with the new test number; and
replacing the specification number with the base number.

3. The method of claim 1, wherein the new test number is assigned by setting the new test number to a next test number in the current test number range.

4. The method of claim 1, further comprising:
associating, in said test number database, i) the index information, ii) the new test number, and iii) the base number, whereby the base number serves as a specification number for its corresponding test number.

5. The method of claim 1, further comprising, storing said information in said test number database as a plurality of linked data nodes.

6. The method of claim 5, wherein one of said linked data nodes is a test number data node, said test number data node storing the new test number and the base number, said test node being a child of a second data node, and said second node storing at least the identifier of the subtest.

7. The method of claim 1, wherein, if a plurality of test number factors have been specified for various levels of the current testflow context, determining the base number for the current test number range comprises aggregating the plurality of test number factors.

8. The method of claim 7, wherein aggregating the plurality of test number factors comprises summing at least two test number factors.

9. The method of claim 1, wherein determining the base number for the current test number range comprises setting the base number to a user-specified base number.

10. A test number engine, comprising:
computer readable media; and
program code, stored on said computer readable media, comprising:
code to, in response to a call for a test number, index a map of linked data nodes using a key formed from i) a numeric identifier of a subtest, and ii) an array of one or more current test flow context values;
code to, upon indexing a data node associated with a test number, compare a specification number associated with the test number to a base number associated with the call;
code to, if the base number and specification number match, satisfy the call by returning the test number;
code to, upon a miss in indexing the map, or upon a mismatch between the base and specification numbers, generate a new test number, satisfy the call by returning the new test number, and associate the new test number with a data node that is linked in the map.

11. The test number engine of claim 10, further comprising code to, upon a mismatch between the base and specification numbers, utilize the array of one or more current test flow context values to automatically regenerate a group of test numbers linked to a common data node of the map.

12. The test number engine of claim 10, wherein the program code further comprises code to maintain said array of current test flow context values.

* * * * *